United States Patent
Yanagihara (10) Patent No.: US 12,119,794 B2
(45) Date of Patent: Oct. 15, 2024

(54) POWER AMPLIFIER CIRCUIT

(71) Applicant: Murata Manufacturing Co., Ltd., Kyoto (JP)

(72) Inventor: Shingo Yanagihara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 529 days.

(21) Appl. No.: 17/470,115

(22) Filed: Sep. 9, 2021

(65) Prior Publication Data

US 2021/0408982 A1 Dec. 30, 2021

Related U.S. Application Data

(63) Continuation-in-part of application No. 17/237,276, filed on Apr. 22, 2021.

(30) Foreign Application Priority Data

Apr. 28, 2020 (JP) .................................. 2020-079823
Nov. 9, 2020 (JP) .................................. 2020-186655

(51) Int. Cl.
*H03F 1/02* (2006.01)
*H03F 3/21* (2006.01)

(52) U.S. Cl.
CPC .......... *H03F 3/211* (2013.01); *H03F 2200/09* (2013.01); *H03F 2200/451* (2013.01)

(58) Field of Classification Search
CPC ..................................... H03F 1/02; H03F 1/07
USPC ............................................. 330/295, 124 R
See application file for complete search history.

(56) References Cited

U.S. PATENT DOCUMENTS

| | | | |
|---|---|---|---|
| 5,867,061 A * | 2/1999 | Rabjohn | H03F 3/42 330/276 |
| 7,190,219 B2 | 3/2007 | Burns et al. | |
| 7,486,141 B2 * | 2/2009 | Do | H03F 3/265 330/276 |
| 7,961,048 B2 * | 6/2011 | Oakley | H03F 3/211 330/124 R |
| 8,130,041 B2 | 3/2012 | Kim et al. | |
| 8,547,174 B1 * | 10/2013 | Schemmann | H03F 3/08 330/149 |
| 8,917,145 B2 | 12/2014 | Song et al. | |

(Continued)

FOREIGN PATENT DOCUMENTS

WO 2015/001851 A1 1/2015

*Primary Examiner* — Henry Choe
(74) *Attorney, Agent, or Firm* — Pearne & Gordon LLP (57) ABSTRACT

A power amplifier circuit includes a first power amplifier, a balun, a second power amplifier, and a third power amplifier. The second and third power amplifiers each include unit bipolar transistors each including a first terminal electrically connected to a reference potential, a second terminal, and a third terminal that outputs an amplified signal; a common input terminal electrically connected to the second terminals of the transistors and receives an RF signal; a common bias terminal electrically connected to the second terminals of the transistors and receives a bias current; a common output terminal electrically connected to the third terminals of the transistors and outputs the amplified signal; and resistance elements each of which is electrically connected between the common input terminal and the second terminal of a corresponding one of the transistors and cuts a DC component of the bias current.

19 Claims, 6 Drawing Sheets

(56) References Cited

U.S. PATENT DOCUMENTS

| | | |
|---|---|---|
| 9,705,451 B2 | 7/2017 | Takenaka et al. |
| 11,671,061 B2 | 6/2023 | Gebeyehu et al. |
| 2004/0145402 A1 | 7/2004 | Burns et al. |
| 2007/0152751 A1 | 7/2007 | Do et al. |
| 2009/0231033 A1 | 9/2009 | Yamada |
| 2010/0148877 A1* | 6/2010 | Oakley ............ H03F 3/604 330/253 |
| 2012/0200359 A1 | 8/2012 | Karthaus et al. |
| 2015/0054581 A1 | 2/2015 | Omid-Zohoor |
| 2015/0180423 A1 | 6/2015 | Sankaranarayanan |
| 2016/0056769 A1 | 2/2016 | Takenaka et al. |

\* cited by examiner

POWER AMPLIFIER CIRCUIT

CROSS REFERENCE TO RELATED APPLICATION

This application is a continuation-in-part of U.S. application Ser. No. 17/237,276 filed on Apr. 22, 2021, which claims priority from Japanese Patent Application No. 2020-079823 filed on Apr. 28, 2020 and Japanese Patent Application No. 2020-186655 filed on Nov. 9, 2020. The contents of these applications are incorporated herein by reference in their entireties.

BACKGROUND

The present disclosure relates to a power amplifier circuit.

International Publication No. 2015/001851 describes a power amplifier module including a transistor. According to International Publication No. 2015/001851, an alternating current (AC) signal is input to the base of the transistor without necessarily via a direct current (DC) cut capacitor.

BRIEF SUMMARY

An amplifier circuit may include a multi-finger transistor including a plurality of unit transistors (also referred to as fingers) that are electrically connected in parallel to each other. Each unit transistor is a minimum element of the transistor. In the present disclosure, a multi-finger transistor is defined as a transistor that includes a plurality of unit transistors connected in parallel to each other so as to behave as a single transistor circuit and that includes a plurality of emitters.

When the bases of a plurality of unit transistors are electrically connected in parallel to each other without necessarily via a DC cut capacitor, a large bias current may flow into the base of one of the unit transistors. For example, a difference in temperature between the unit transistors may cause a difference in input impedance (input resistance) between the bases of the unit transistors. Also, for example, an individual difference between the unit transistors may cause a difference in input impedance between the bases of the unit transistors. In this case, a large bias current flows into the base of the unit transistor having the lowest input impedance, and the bias current flowing into the bases of the other unit transistors decreases accordingly. This results in uneven operation of the plurality of unit transistors. The uneven operation of the plurality of unit transistors hinders a desired amplification characteristic from being obtained.

The present disclosure achieves even operation of a plurality of unit transistors.

According to embodiments of the present disclosure, a power amplifier circuit includes a first power amplifier formed in or on a first chip; a balun including a primary winding and a secondary winding, the primary winding having a first end connected to the first power amplifier and a second end electrically connected to a reference potential; a second power amplifier formed in or on a second chip and electrically connected to a first end of the secondary winding of the balun; and a third power amplifier formed in or on the second chip and electrically connected to a second end of the secondary winding of the balun. The first power amplifier includes a plurality of field-effect transistors that are stack-connected. The second power amplifier and the third power amplifier each include a plurality of unit bipolar transistors each including a first terminal that is electrically connected to the reference potential, a second terminal that receives a radio-frequency signal and a bias current, and a third terminal that outputs an amplified signal obtained by amplifying the radio-frequency signal; a common input terminal that is electrically connected in parallel to the second terminals of the plurality of unit bipolar transistors and that receives the radio-frequency signal; a common bias terminal that is electrically connected in parallel to the second terminals of the plurality of unit bipolar transistors and that receives the bias current; a common output terminal that is electrically connected in parallel to the third terminals of the plurality of unit bipolar transistors and that outputs the amplified signal; and a plurality of resistance elements each of which is electrically connected between the common input terminal and the second terminal of a corresponding one of the plurality of unit bipolar transistors and each of which cuts a direct current component of the bias current.

According to the embodiments of the present disclosure, it is possible to achieve even operation of a plurality of unit transistors.

Other features, elements, characteristics and advantages of the present disclosure will become more apparent from the following detailed description of embodiments of the present disclosure with reference to the attached drawings.

DETAILED DESCRIPTION

Hereinafter, a power amplifier circuit according to embodiments of the present disclosure will be described in detail with reference to the attached drawings. Note that the embodiments described below do not limit the present disclosure. Each embodiment is merely an example, and it is obviously possible to partially replace or combine elements described in different embodiments. In second to fifth embodiments, the same features as those of a first embodiment will not be described, and only differences will be described. In particular, similar functions and effects of similar configurations will not be repeatedly described in each embodiment.

First Embodiment and Comparative Example

Hereinafter, a first embodiment will be described. To facilitate the understanding of the first embodiment, a comparative example will be described first.

Comparative Example

Figure 1:
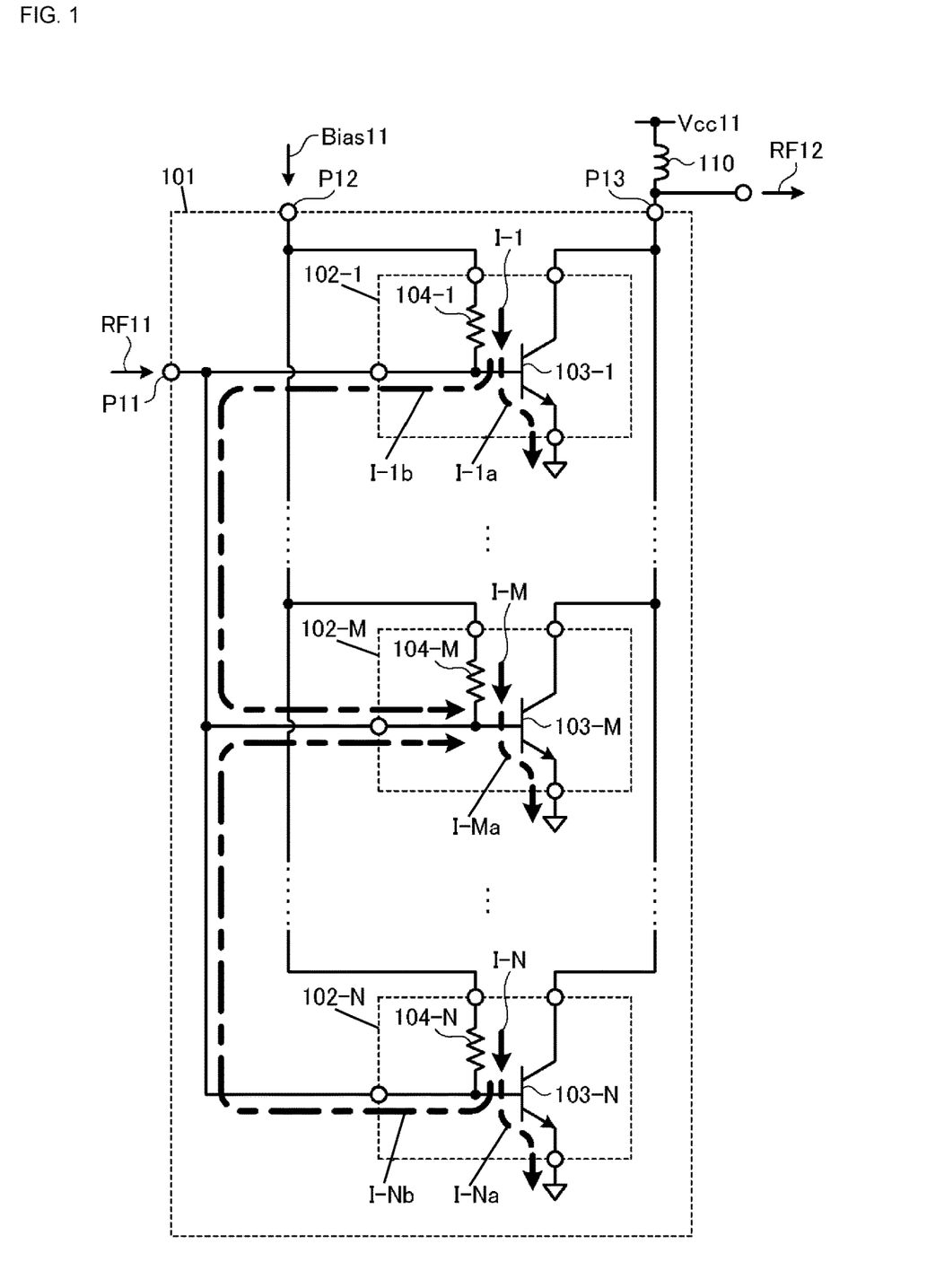
FIG. 1 is a diagram illustrating the configuration of a multi-finger transistor according to a comparative example.

FIG. 1 is a diagram illustrating the configuration of a multi-finger transistor 101 according to the comparative example. The multi-finger transistor 101 includes a plurality of unit transistors electrically connected in parallel to each other. Each unit transistor is a minimum element of the transistor.

The multi-finger transistor 101 includes a first terminal P11 that receives an alternating current (AC) signal RF11, a second terminal P12 that receives a bias current Bias11, and a third terminal P13 that outputs an AC signal RF12. The third terminal P13 is electrically connected to a power supply potential Vcc11 via a choke inductor 110.

The multi-finger transistor 101 receives power supplied from the power supply potential Vcc11 and is brought into an electric bias state by the bias current Bias11. The multi-finger transistor 101 amplifies the AC signal RF11 and outputs the amplified AC signal RF12.

The multi-finger transistor 101 includes N cells 102-1 to 102-N. N is an integer greater than or equal to 2. The cell 102-1 includes a unit transistor 103-1 and a resistor 104-1. The cell 102-M includes a unit transistor 103-M and a resistor 104-M. M is an integer greater than 1 and smaller than N. The cell 102-N includes a unit transistor 103-N and a resistor 104-N. The resistors 104-1 to 104-N each have a resistance value of, for example, about 180Ω to about 200Ω. Note that the present disclosure is not limited thereto.

In the present disclosure, a unit transistor is a bipolar transistor, but the present disclosure is not limited thereto. The bipolar transistor may be a heterojunction bipolar transistor (HBT), but the present disclosure is not limited thereto. The unit transistor may be, for example, a field-effect transistor (FET).

The emitter or source of each unit transistor corresponds to an example of a "first terminal" of the present disclosure. The base or gate of each unit transistor corresponds to an example of a "second terminal" of the present disclosure. The collector or drain of each unit transistor corresponds to an example of a "third terminal" of the present disclosure.

The emitter of each unit transistor 103 is electrically connected to a reference potential. The reference potential may be a ground potential, but the present disclosure is not limited thereto. The base of each unit transistor 103 is electrically connected to the first terminal P11. One end of each resistor 104 is electrically connected to the second terminal P12. The other end of each resistor 104 is electrically connected to the base of the corresponding unit transistor 103. The collector of each unit transistor 103 is electrically connected to the third terminal P13.

It is assumed that the AC signal RF11 does not contain a direct current (DC) component but contains only an AC component. Thus, each cell 102 does not need to include a DC cut capacitor in the path between the first terminal P11 and the base of the corresponding unit transistor 103.

A current I-1 flows through the resistor 104-1. A current I-M flows through the resistor 104-M. A current I-N flows through the resistor 104-N. The sum of the currents I-1 to I-N is equal to the bias current Bias11.

If the individual unit transistors 103 have the same electric characteristics, all the current I-1 flows through a base-emitter path of the unit transistor 103-1, all the current I-M flows through a base-emitter path of the unit transistor 103-M, and all the current I-N flows through a base-emitter path of the unit transistor 103-N.

However, for example, a difference in temperature between the unit transistors 103 may cause a difference in input impedance (input resistance) between the bases of the unit transistors 103. Also, for example, an individual difference between the unit transistors 103 may cause a difference in input impedance between the bases of the unit transistors 103.

Here, it is assumed that the input impedance of the unit transistor 103-M is lower than the input impedances of the other unit transistors 103, in other words, the unit transistor 103-M has the lowest input impedance.

In this case, a part of the current I-1 flows, as a current I-1a, through the base-emitter path of the unit transistor 103-1, whereas the other part of the current I-1 flows, as a current I-1b, through the base-emitter path of the unit transistor 103-M. Likewise, a part of the current I-N flows, as a current I-Na, through the base-emitter path of the unit transistor 103-N, whereas the other part of the current I-N flows, as a current I-Nb, through the base-emitter path of the unit transistor 103-M.

Thus, a current I-Ma flowing through the base-emitter path of the unit transistor 103-M is the sum of the current I-M and the currents flowing thereinto from the other cells. This causes a large bias current to flow through the base-emitter path of the unit transistor 103-M and causes a small bias current to flow through the base-emitter paths of the other unit transistors 103. This results in uneven operation of the plurality of unit transistors 103. The uneven operation of the plurality of unit transistors 103 hinders a desired amplification characteristic from being obtained.

First Embodiment

Figure 2:
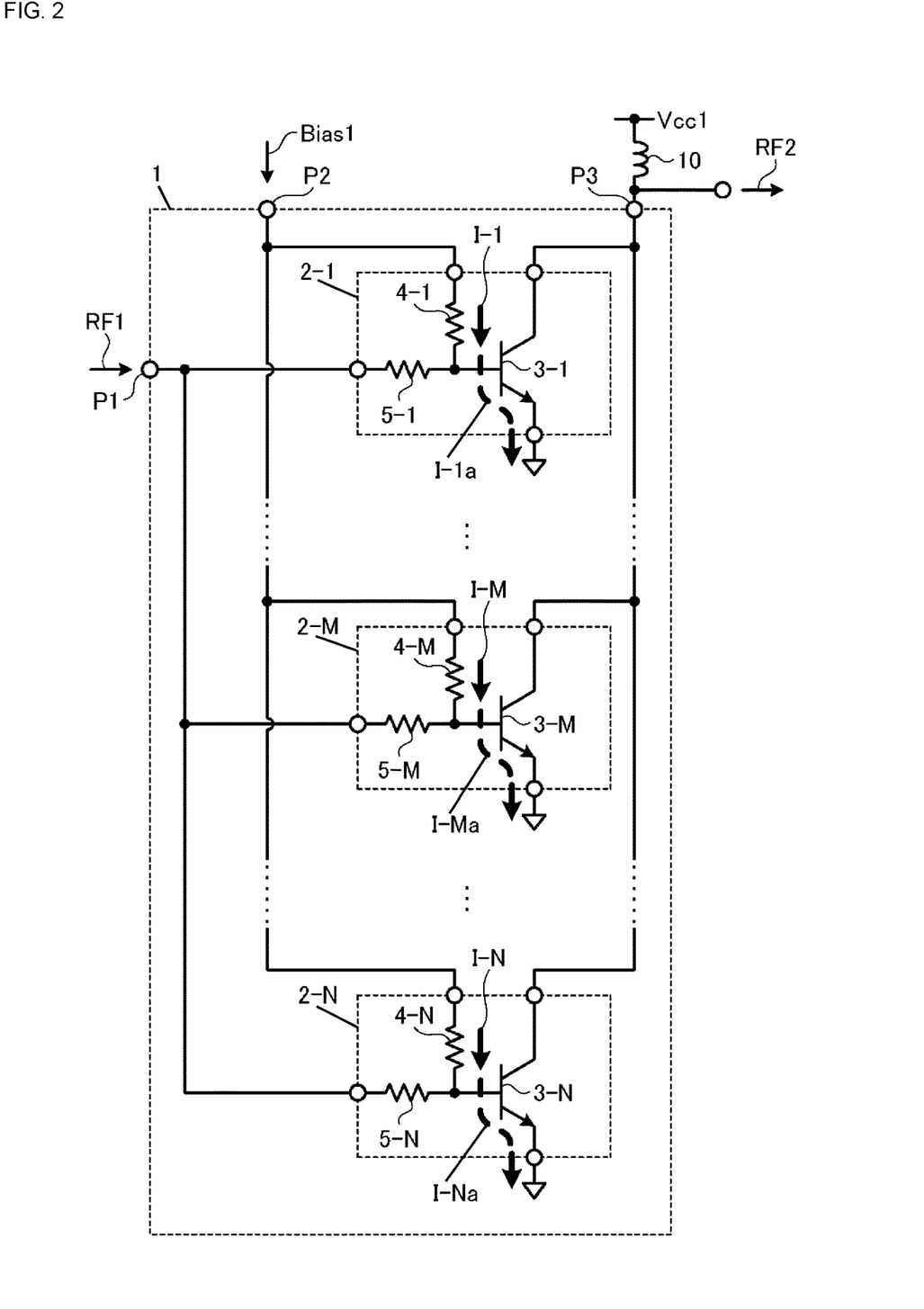
FIG. 2 is a diagram illustrating the configuration of a multi-finger transistor according to a first embodiment.

FIG. 2 is a diagram illustrating the configuration of a multi-finger transistor 1 according to the first embodiment. The multi-finger transistor 1 includes a plurality of unit transistors electrically connected in parallel to each other. Each unit transistor is a minimum element of the transistor.

The multi-finger transistor 1 includes a first terminal P1 that receives an AC signal RF1, a second terminal P2 that receives a bias current Bias1, and a third terminal P3 that outputs an AC signal RF2. The third terminal P3 is electrically connected to a power supply potential Vcc1 via a choke inductor 10.

The first terminal P1 corresponds to an example of a "common input terminal" of the present disclosure. The second terminal P2 corresponds to an example of a "common bias terminal" of the present disclosure. The third terminal P3 corresponds to an example of a "common output terminal" of the present disclosure.

The multi-finger transistor 1 receives power supplied from the power supply potential Vcc1 and is brought into an electric bias state by the bias current Bias1. The multi-finger transistor 1 amplifies the AC signal RF1 and outputs the amplified AC signal RF2.

The multi-finger transistor 1 includes N cells 2-1 to 2-N. The cell 2-1 includes a unit transistor 3-1, a resistor 4-1, and a resistor 5-1. The cell 2-M includes a unit transistor 3-M, a resistor 4-M, and a resistor 5-M. The cell 2-N includes a unit transistor 3-N, a resistor 4-N, and a resistor 5-N. The resistors 4-1 to 4-N each have a resistance value of, for example, about 180Ω to about 200Ω. Note that the present disclosure is not limited thereto. The resistors 5-1 to 5-N each have a resistance value of, for example, about 1Ω. Note that the present disclosure is not limited thereto. The resistors 5-1 to 5-N each have, for example, a smaller resistance value than the resistance value of a corresponding one of the resistors 4-1 to 4-N. Note that the present disclosure is not limited thereto. The resistors 4-1 to 4-N each have, for example, a resistance value that is five times or more the resistance value of a corresponding one of the resistors 5-1 to 5-N. Note that the present disclosure is not limited thereto.

The resistors 5 correspond to an example of "first resistance elements" of the present disclosure. The resistors 4 correspond to an example of "second resistance elements" of the present disclosure.

The emitter of each unit transistor 3 is electrically connected to a reference potential. One end of each resistor 5 is electrically connected to the base of the corresponding unit transistor 3. The other end of each resistor 5 is electrically connected to the first terminal P1. One end of each resistor 4 is electrically connected to the base of the corresponding unit transistor 3. The other end of each resistor 4 is electrically connected to the second terminal P2. The collector of each unit transistor 3 is electrically connected to the third terminal P3.

The AC signal RF1 contains only an AC component. Thus, each cell 2 does not need to include a DC cut capacitor in the path between the first terminal P1 and the base of the corresponding unit transistor 3.

A current I-1 flows through the resistor 4-1. A current I-M flows through the resistor 4-M. A current I-N flows through the resistor 4-N. The sum of the currents I-1 to I-N is equal to the bias current Bias1.

For example, a difference in temperature between the unit transistors 3 may cause a difference in input impedance (input resistance) between the bases of the unit transistors 3. Also, for example, an individual difference between the unit transistors 3 may cause a difference in input impedance between the bases of the unit transistors 3.

Here, it is assumed that the input impedance of the unit transistor 3-M is lower than the input impedances of the other unit transistors 3, in other words, the unit transistor 3-M has the lowest input impedance.

However, the one end of each resistor 4 is electrically connected to the base of the corresponding unit transistor 3 and is also electrically connected to the one end of the corresponding resistor 5.

The presence of the resistor 5-1 hinders the current I-1 flowing through the resistor 4-1 from flowing toward the resistor 5-1, and thus the current I-1 becomes a current I-1a flowing through a base-emitter path of the unit transistor 3-1. Likewise, the presence of the resistor 5-M hinders the current I-M flowing through the resistor 4-M from flowing toward the resistor 5-M, and thus the current I-M becomes a current I-Ma flowing through a base-emitter path of the unit transistor 3-M. Likewise, the presence of the resistor 5-N hinders the current I-N flowing through the resistor 4-N from flowing toward the resistor 5-N, and thus the current I-N becomes a current I-Na flowing through a base-emitter path of the unit transistor 3-N.

Accordingly, uneven operation of the unit transistors 3 is suppressed, and thus a desired amplification characteristic is obtained.

Each resistor 5 will be illustrated below, but the present disclosure is not limited thereto.

When a multi-finer transistor is regarded as a single transistor, a combined resistance of each resistor 5 is, for example, about 0.5Ω or more. Thus, the resistance value of the resistors 5 connected to the unit transistors is, when the number of unit transistors is N, for example, about (0.5×N) Ω or more.

The resistance value of each resistor 5 is, for example, smaller than the resistance value of an emitter ballast resistor of the corresponding unit transistor 3. The emitter ballast resistor has, for example, about 200Ω, but the present disclosure is not limited thereto.

The resistance value of each resistor 5 is, for example, a resistance value corresponding to the impedance of a DC cut capacitor that is typically connected to the base of the corresponding unit transistor 3, but the present disclosure is not limited thereto. For example, it is typically assumed that, when the AC signal RF1 has a frequency in the band of about 0.9 GHz, a DC cut capacitor of about 2 pF is connected in series to the base of each unit transistor 3. In this case, the resistance value corresponding to an impedance of about (1/ωC) of the DC cut capacitor is about 88Ω.

Second Embodiment

Figure 3:
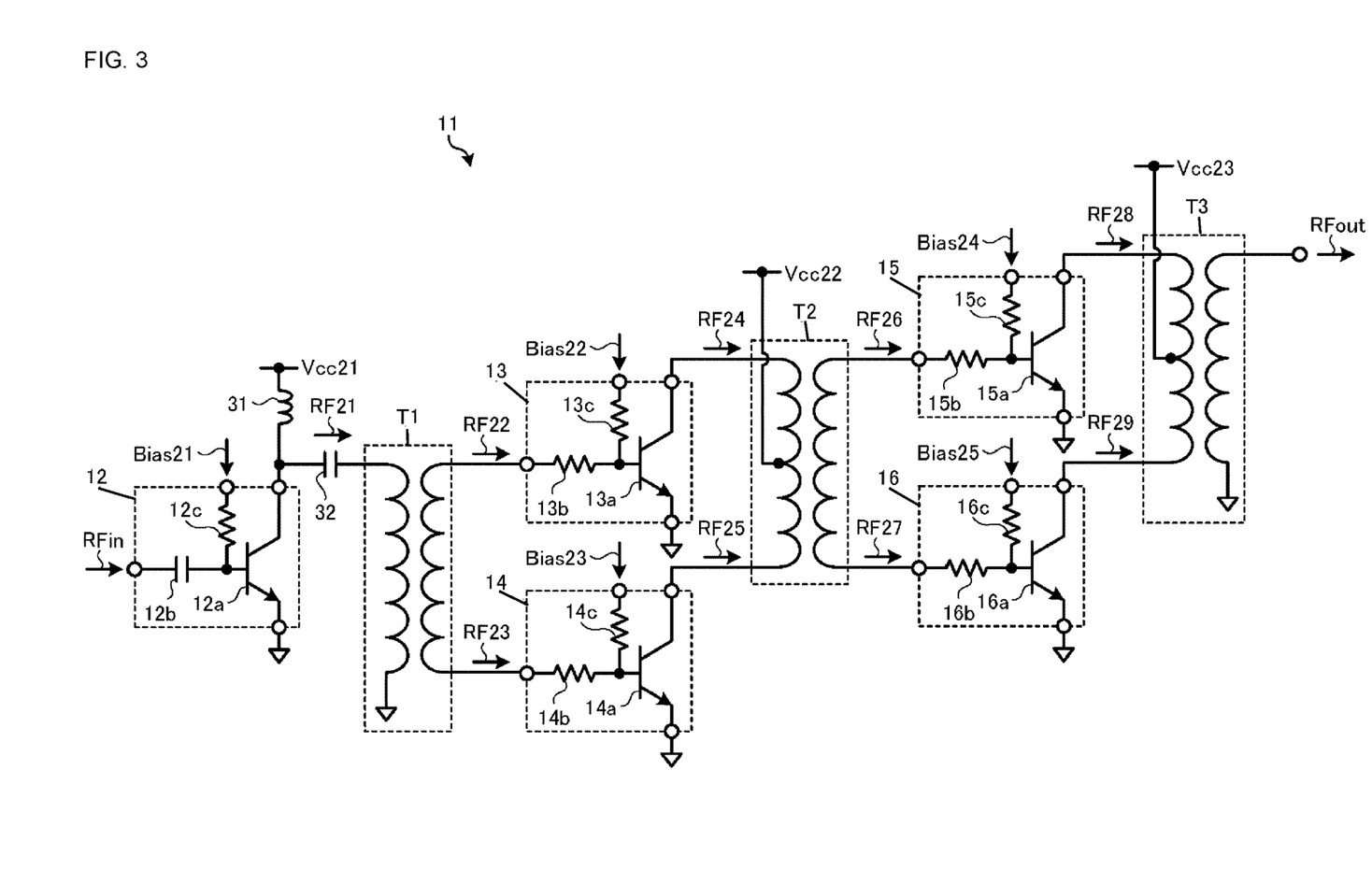
FIG. 3 is a diagram illustrating the configuration of a power amplifier circuit according to a second embodiment.

FIG. 3 is a diagram illustrating the configuration of a power amplifier circuit 11 according to a second embodiment. Specifically, FIG. 3 is a diagram illustrating the configuration of the power amplifier circuit 11 to which the multi-finger transistor 1 according to the first embodiment is applied.

The power amplifier circuit 11 may be implemented by a hybrid integrated circuit (IC) or module in which a plurality of components (semiconductor chips or the like) are mounted on a single substrate, but the present disclosure is not limited thereto.

The power amplifier circuit 11 includes a multi-finger transistor 12 serving as a first-stage power amplifier, multi-finger transistors 13 and 14 serving as second-stage power amplifiers, and multi-finger transistors 15 and 16 serving as third-stage power amplifiers. The number of stages of the power amplifiers is not limited to three, and may be two or less, or may be four or more.

The multi-finger transistor 12 is a typical multi-finger transistor in which a DC cut capacitor is connected in series to the base thereof. The multi-finger transistors 13 to 16 each have the same circuit configuration as that of the multi-finger transistor 1 according to the first embodiment (see FIG. 2).

The multi-finger transistor 12 includes cells each including a unit transistor 12a, a DC cut capacitor 12b, and a resistor 12c.

The emitter of the unit transistor 12a of each cell of the multi-finer transistor 12 is electrically connected to a reference potential. A radio-frequency (RF) input signal RFin is input to the base of the unit transistor 12a of each cell via the DC cut capacitor 12b of the cell. A bias current Bias21 is input to the base of the unit transistor 12a of each cell via the resistor 12c of the cell. The collector of the unit transistor 12a of each cell is electrically connected to a power supply potential Vcc21 via a choke inductor 31. The unit transistor 12a of each cell outputs an RF signal RF21 from the collector to one end of a primary winding of a balun T1 via a DC cut capacitor 32.

The other end of the primary winding of the balun T1 is electrically connected to the reference potential. An RF signal RF22 is output from one end of a secondary winding of the balun T1 to the base of the multi-finger transistor 13. An RF signal RF23 is output from the other end of the secondary winding of the balun T1 to the base of the multi-finger transistor 14.

The multi-finger transistor 13 includes cells each including a unit transistor 13a and resistors 13b and 13c.

The emitter of the unit transistor 13a of each cell of the multi-finer transistor 13 is electrically connected to the reference potential. The RF signal RF22 is input to the base of the unit transistor 13a of each cell via the resistor 13b of the cell.

The RF signal RF22 output from the secondary winding of the balun T1 does not contain a DC component, and thus a DC cut capacitor is optional between the secondary winding of the balun T1 and the base of the unit transistor 13a of each cell.

A bias current Bias22 is input to the base of the unit transistor 13a of each cell via the resistor 13c of the cell. The collector of the unit transistor 13a of each cell is electrically connected to one end of a primary winding of a balun T2. The unit transistor 13a of each cell outputs an RF signal RF24 from the collector to the one end of the primary winding of the balun T2.

The multi-finger transistor 14 includes cells each including a unit transistor 14a and resistors 14b and 14c.

The emitter of the unit transistor 14a of each cell of the multi-finer transistor 14 is electrically connected to the reference potential. The RF signal RF23 is input to the base of the unit transistor 14a of each cell via the resistor 14b of the cell.

The RF signal RF23 output from the secondary winding of the balun T1 does not contain a DC component, and thus a DC cut capacitor is optional between the secondary winding of the balun T1 and the base of the unit transistor 14a of each cell.

A bias current Bias23 is input to the base of the unit transistor 14a of each cell via the resistor 14c of the cell. The collector of the unit transistor 14a of each cell is electrically connected to the other end of the primary winding of the balun T2. The unit transistor 14a of each cell outputs an RF signal RF25 from the collector to the other end of the primary winding of the balun T2.

The midpoint of the primary winding of the balun T2 is electrically connected to a power supply potential Vcc22. The power supply potential Vcc22 is supplied to the collectors of the multi-finger transistors 13 and 14 via the primary winding of the balun T2.

An RF signal RF26 is output from one end of a secondary winding of the balun T2 to the base of the multi-finger transistor 15. An RF signal RF27 is output from the other end of the secondary winding of the balun T2 to the base of the multi-finger transistor 16.

The multi-finger transistor 15 includes cells each including a unit transistor 15a and resistors 15b and 15c.

The emitter of the unit transistor 15a of each cell of the multi-finer transistor 15 is electrically connected to the reference potential. The RF signal RF26 is input to the base of the unit transistor 15a of each cell via the resistor 15b of the cell.

The RF signal RF26 output from the secondary winding of the balun T2 does not contain a DC component, and thus a DC cut capacitor is optional between the secondary winding of the balun T2 and the base of the unit transistor 15a of each cell.

A bias current Bias24 is input to the base of the unit transistor 15a of each cell via the resistor 15c of the cell. The collector of the unit transistor 15a of each cell is electrically connected to one end of a primary winding of a balun T3. The unit transistor 15a of each cell outputs an RF signal RF28 from the collector to the one end of the primary winding of the balun T3.

The multi-finger transistor 16 includes cells each including a unit transistor 16a and resistors 16b and 16c.

The emitter of the unit transistor 16a of each cell of the multi-finer transistor 16 is electrically connected to the reference potential. The RF signal RF27 is input to the base of the unit transistor 16a of each cell via the resistor 16b of the cell.

The RF signal RF27 output from the secondary winding of the balun T2 does not contain a DC component, and thus a DC cut capacitor is optional between the secondary winding of the balun T2 and the base of the unit transistor 16a of each cell.

A bias current Bias25 is input to the base of the unit transistor 16a of each cell via the resistor 16c of the cell. The collector of the unit transistor 16a of each cell is electrically connected to the other end of the primary winding of the balun T3. The unit transistor 16a of each cell outputs an RF signal RF29 from the collector to the other end of the primary winding of the balun T3.

The midpoint of the primary winding of the balun T3 is electrically connected to a power supply potential Vcc23. The power supply potential Vcc23 is supplied to the collectors of the multi-finger transistors 15 and 16 via the primary winding of the balun T3.

One end of a secondary winding of the balun T3 is electrically connected to the reference potential. An RF output signal RFout is output from the other end of the secondary winding of the balun T3.

With this configuration, the power amplifier circuit 11 does not have a DC cut capacitance in each of the intermediate stage and the output stage, and thus a filter effect, which is based on a time constant determined by the product of the resistances connected to the bias circuit (for example, the resistors 13c, 14c, 15c, and 16c) and the capacitance, is not obtained. Thus, there is no limitation on the band resulting from a modulation band width.

Third Embodiment

Figure 4:
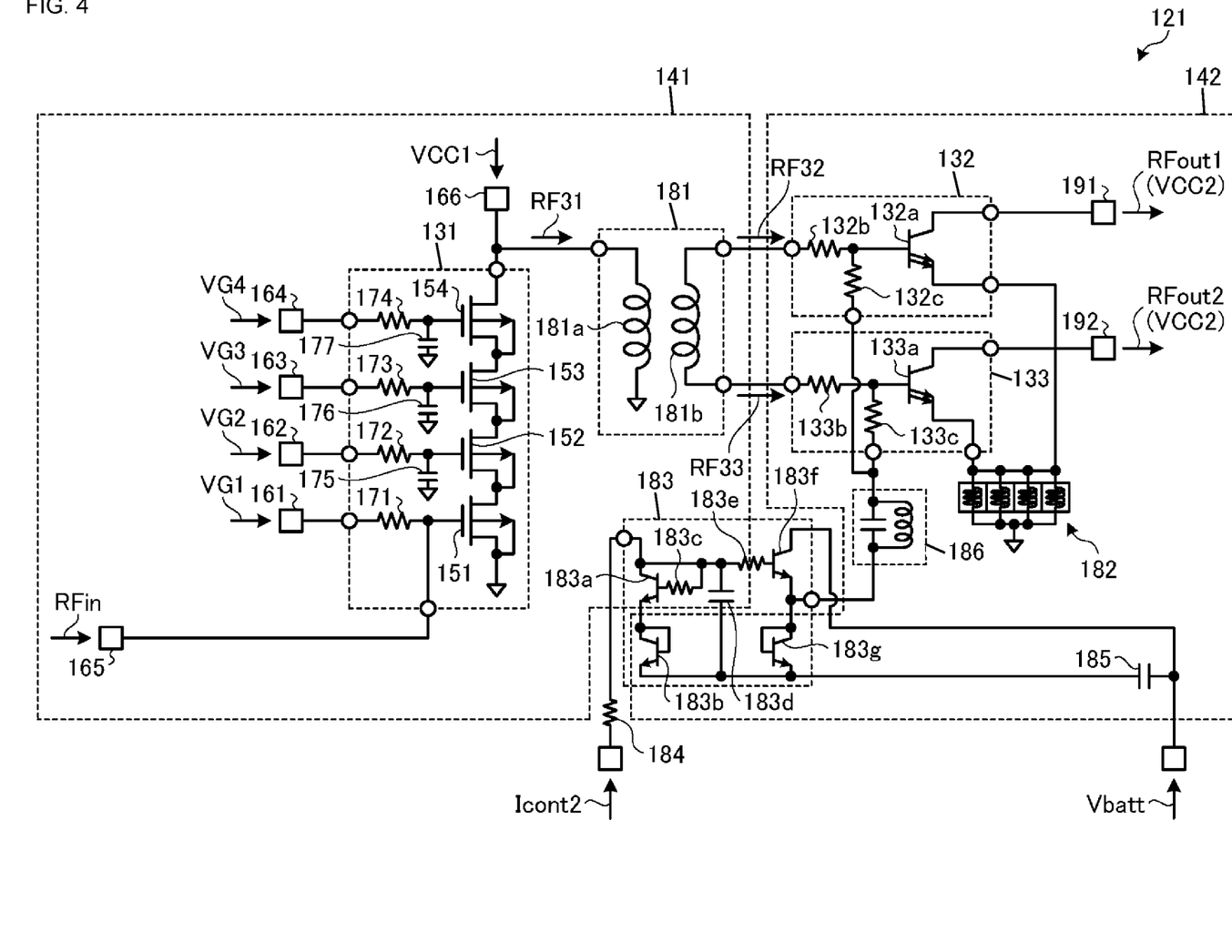
FIG. 4 is a diagram illustrating the configuration of a power amplifier circuit according to a third embodiment.

FIG. 4 is a diagram illustrating the configuration of a power amplifier circuit 121 according to a third embodiment. Specifically, FIG. 4 is a diagram illustrating the configuration of the power amplifier circuit 121 to which the multi-finger transistor 1 according to the first embodiment is applied.

The power amplifier circuit 121 may be implemented by a hybrid IC or module in which a plurality of components (semiconductor chips or the like) are mounted on a single substrate, but the present disclosure is not limited thereto.

The power amplifier circuit 121 includes a power amplifier 131 of a first stage and power amplifiers 132 and 133 of a second stage. The number of stages of the power amplifiers is not limited to two, and may be three or more.

The power amplifier 131 corresponds to an example of a "first power amplifier" of the present disclosure. The power amplifier 132 corresponds to an example of a "second power amplifier" of the present disclosure. The power amplifier 133 corresponds to an example of a "third power amplifier" of the present disclosure.

The power amplifier 131 is formed in or on a first chip 141. The first chip 141 is a silicon (Si) chip. The silicon chip may be, for example, a silicon on insulator (SOI) chip or a complementary metal oxide semiconductor (CMOS) chip, but the present disclosure is not limited thereto. The power amplifier 131 includes transistors 151 to 154. The transistors 151 to 154 are FETs.

The power amplifiers 132 and 133 are formed in or on a second chip 142. The second chip 142 may be, for example, a gallium arsenide (GaAs) chip, a gallium nitride (GaN) chip, an indium phosphide (InP) chip, or a silicon germanium (SiGe) chip, but the present disclosure is not limited thereto. The power amplifiers 132 and 133 are each formed of a multi-finger transistor. The multi-finger transistor is an HBT. The multi-finger transistor has the same circuit configuration as that of the multi-finger transistor 1 according to the first embodiment (see FIG. 2). The multi-finger transistor of the power amplifier 132 includes cells each including a unit transistor 132a and resistors 132b and 132c. The multi-finger transistor of the power amplifier 133 includes cells each including a unit transistor 133a and resistors 133b and 133c.

The source of the transistor 151 in the power amplifier 131 is electrically connected to a reference potential. A bias voltage VG1 is input to the gate of the transistor 151 via a terminal 161 and a resistor 171. An RF input signal RFin is input to the gate of the transistor 151 via a terminal 165.

The source of the transistor 152 is electrically connected to the drain of the transistor 151. A bias voltage VG2 is input to the gate of the transistor 152 via a terminal 162 and a resistor 172. The gate of the transistor 152 is electrically connected to the reference potential via a capacitor 175.

The source of the transistor 153 is electrically connected to the drain of the transistor 152. A bias voltage VG3 is input to the gate of the transistor 153 via a terminal 163 and a resistor 173. The gate of the transistor 153 is electrically connected to the reference potential via a capacitor 176.

The source of the transistor 154 is electrically connected to the drain of the transistor 153. A bias voltage VG4 is input to the gate of the transistor 154 via a terminal 164 and a resistor 174. The gate of the transistor 154 is electrically connected to the reference potential via a capacitor 177. A power supply voltage VCC1 is input to the drain of the transistor 154 via a terminal 166.

That is, the power amplifier 131 includes the transistors 151 to 154 that are stack-connected in four stages. The present disclosure is not limited thereto. The power amplifier 131 may have a configuration of a two-stage or three-stage stack connection or a configuration of a five or more-stage stack connection.

The power amplifier 131 amplifies the RF input signal RFin and outputs an RF signal RF31.

In the power amplifier circuit 121, the first stage includes a single power amplifier 131, but the present disclosure is not limited thereto. The first stage may include a plurality of power amplifiers 131 connected in parallel to each other.

The power amplifier circuit 121 includes a balun 181. The balun 181 is formed in or on the first chip 141. The balun 181 may be formed in or on the second chip 142. However, windings use a large chip area, and a silicon chip is less expensive than a gallium arsenide chip. Thus, the balun 181 may be formed in or on the first chip 141 to reduce the cost.

One end of a primary winding 181a of the balun 181 is electrically connected to the drain of the transistor 154. The other end of the primary winding 181a is electrically connected to the reference potential. The RF signal RF31 is input to the one end of the primary winding 181a.

An RF signal RF32 is output from one end of a secondary winding 181b of the balun 181 to one end of the resistor 132b of each cell. An RF signal RF33 is output from the other end of the secondary winding 181b of the balun 181 to one end of the resistor 133b of each cell.

The emitter of the unit transistor 132a of each cell is electrically connected to the reference potential via a choke coil 182. The RF signal RF32 is input to the base of the unit transistor 132a of each cell via the resistor 132b.

The RF signal RF32 output from the one end of the secondary winding 181b of the balun 181 does not contain a DC component, and thus a DC cut capacitor is optional between the one end of the secondary winding 181b of the balun 181 and the base of the unit transistor 132a of each cell.

The emitter of the unit transistor 133a of each cell is electrically connected to the reference potential via the choke coil 182. The RF signal RF33 is input to the base of the unit transistor 133a of each cell via the resistor 133b.

The RF signal RF33 output from the other end of the secondary winding 181b of the balun 181 does not contain a DC component, and thus a DC cut capacitor is optional between the other end of the secondary winding 181b of the balun 181 and the base of the unit transistor 133a of each cell.

The power amplifier circuit 121 includes a bias circuit 183. The bias circuit 183 includes transistors 183a, 183b, 183f, and 183g, resistors 183c an 183e, and a capacitor 183d.

The bias circuit 183 corresponds to an example of a "first bias circuit" of the present disclosure. The transistor 183b corresponds to an example of a "first transistor" of the present disclosure. The transistor 183a corresponds to an example of a "second transistor" of the present disclosure. The transistor 183g corresponds to an example of a "third transistor" of the present disclosure. The transistor 183f corresponds to an example of a "fourth transistor" of the present disclosure.

One end of the resistor 183c is electrically connected to the collector of the transistor 183a. The other end of the resistor 183c is electrically connected to the base of the transistor 183a. The collector of the transistor 183a and the one end of the resistor 183c are electrically connected to one end of a resistor 184. A current Icont2 is input to the other end of the resistor 184. The resistor 183c may be omitted. That is, the collector and base of the transistor 183a may be directly connected to each other.

The collector and base of the transistor 183b are electrically connected to each other. That is, the transistor 183b is diode-connected. The collector and base of the transistor 183b are electrically connected to the emitter of the transistor 183a. The emitter of the transistor 183b is electrically connected to a power supply voltage Vbatt via a capacitor 185 and is grounded in an AC manner.

A series-connected circuit formed of the transistors 183a and 183b generates a constant voltage in accordance with the current Icont2.

One end of the capacitor 183d is electrically connected to the collector of the transistor 183a and the one end of the resistor 183c. The other end of the capacitor 183d is electrically connected to the power supply voltage Vbatt via the capacitor 185 and is grounded in an AC manner. The capacitor 183d stabilizes a voltage of the series-connected circuit formed of the transistors 183a and 183b.

One end of the resistor 183e is electrically connected to the collector of the transistor 183a, the one end of the resistor 183c, and the one end of the capacitor 183d. The other end of the resistor 183e is electrically connected to the base of the transistor 183f. The resistor 183e may be omitted. That is, the base of the transistor 183f may be directly connected to the collector of the transistor 183a.

A voltage of the series-connected circuit formed of the transistors 183a and 183b is input to the base of the transistor 183f. The collector of the transistor 183f is electrically connected to the power supply voltage Vbatt. The emitter of the transistor 183f is electrically connected to one end of the resistor 132c of each cell and one end of the resistor 133c of each cell via an LC parallel circuit 186. That is, the transistor 183f and the resistor 132c of each cell, and the transistor 183f and the resistor 133c of each cell, are emitter-follower connected.

The collector and base of the transistor 183g are electrically connected to each other. That is, the transistor 183g is diode-connected. The collector and base of the transistor 183g are electrically connected to the emitter of the transistor 183f. The emitter of the transistor 183g is electrically connected to the power supply voltage Vbatt via the capacitor 185 and is grounded in an AC manner.

In a case where the transistor 183b also functions as a temperature detecting element, the transistor 183b may be formed in or on the second chip 142. The transistors 183a, 183f, and 183g may be formed in or on either of the first chip 141 and the second chip 142. From the viewpoint of the cost, the transistors 183a, 183f, and 183g may be formed in or on the first chip 141. From the viewpoint of simplification of wiring, the transistors 183a, 183f, and 183g may be formed in or on the second chip 142.

A bias current is input to the base of the unit transistor 132a of each cell in the power amplifier 132 via the resistor 132c of the cell. The collector of the unit transistor 132a of each cell is electrically connected to a terminal 191. A power supply voltage VCC2 is input to the collector of the unit transistor 132a of each cell via the terminal 191. The unit transistor 132a of each cell amplifies the RF signal RF32 and outputs an RF output signal RFout1 from the collector.

A bias current is input to the base of the unit transistor 133a of each cell in the power amplifier 133 via the resistor 133c of the cell. The collector of the unit transistor 133a of each cell is electrically connected to a terminal 192. The power supply voltage VCC2 is input to the collector of the unit transistor 133a of each cell via the terminal 192. The unit transistor 133a of each cell amplifies the RF signal RF33 and outputs an RF output signal RFout2 from the collector.

The power amplifier circuit 121 is demanded to achieve gain and high output power. The power amplifier circuit 121 is capable of increasing gain by using the power amplifier 131 having a multistage stack configuration of FETs and is also capable of increasing power by using the power amplifiers 132 and 133 of HBTs.

The power amplifier circuit 121 does not require a DC cut capacitor between the balun 181 and the bases of the power amplifiers 132 and 133, and thus the size thereof can be reduced.

The power amplifier circuit 121 is capable of increasing gain by using the power amplifier 131 having a multistage stack configuration of FETs, and thus the number of stages of power amplifiers can be reduced (two stages in this embodiment). Thus, the power amplifier circuit 121 can be easily designed while risk is reduced.

The power amplifier circuit 121 includes the balun 181 between the power amplifier 131 and the power amplifiers 132 and 133. The balun 181 enables the chips to be connected to each other only by a line. Thus, matching is easily achieved and designing is facilitated.

The power amplifier circuit 121 includes the power amplifier 131 formed in or on the first chip 141 that is not expensive, and the power amplifiers 132 and 133 formed in or on the second chip 142, and thus the cost can be reduced.

Fourth Embodiment

Figure 5:
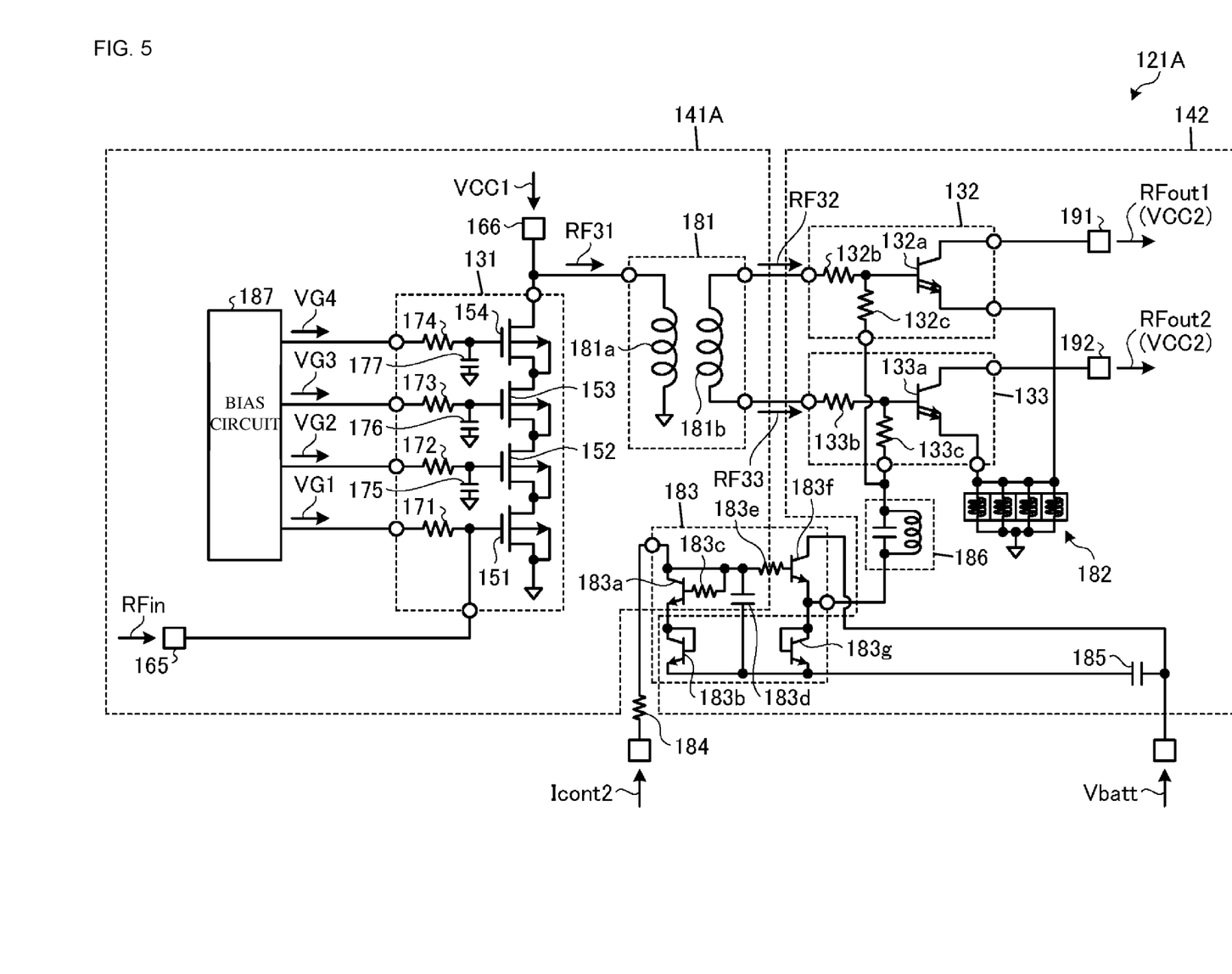
FIG. 5 is a diagram illustrating the configuration of a power amplifier circuit according to a fourth embodiment.

FIG. 5 is a diagram illustrating the configuration of a power amplifier circuit 121A according to a fourth embodiment.

The power amplifier circuit 121A includes a bias circuit 187 that is formed in or on a first chip 141A, as compared with the power amplifier circuit 121 (see FIG. 4).

The bias circuit 187 corresponds to an example of a "second bias circuit" of the present disclosure.

The bias circuit 187 outputs a bias voltage VG1 to the gate of the transistor 151. The bias circuit 187 outputs a bias voltage VG2 to the gate of the transistor 152. The bias circuit 187 outputs a bias voltage VG3 to the gate of the transistor 153. The bias circuit 187 outputs a bias voltage VG4 to the gate of the transistor 154.

In the power amplifier circuit 121A, the bias circuit 187 is formed in or on the first chip 141A, and thus a device in which the power amplifier circuit 121A is to be mounted can be reduced in size.

The power amplifier 131 has four terminals supplied with the bias voltages VG1 to VG4. In this embodiment, the single bias circuit 187 supplies the bias voltages VG1 to VG4 to the respective terminals, but the present disclosure is not limited thereto. A plurality of bias circuits may be formed in or on the first chip 141A, and the plurality of bias circuits may individually supply the voltages to the respective terminals.

Fifth Embodiment

Figure 6:
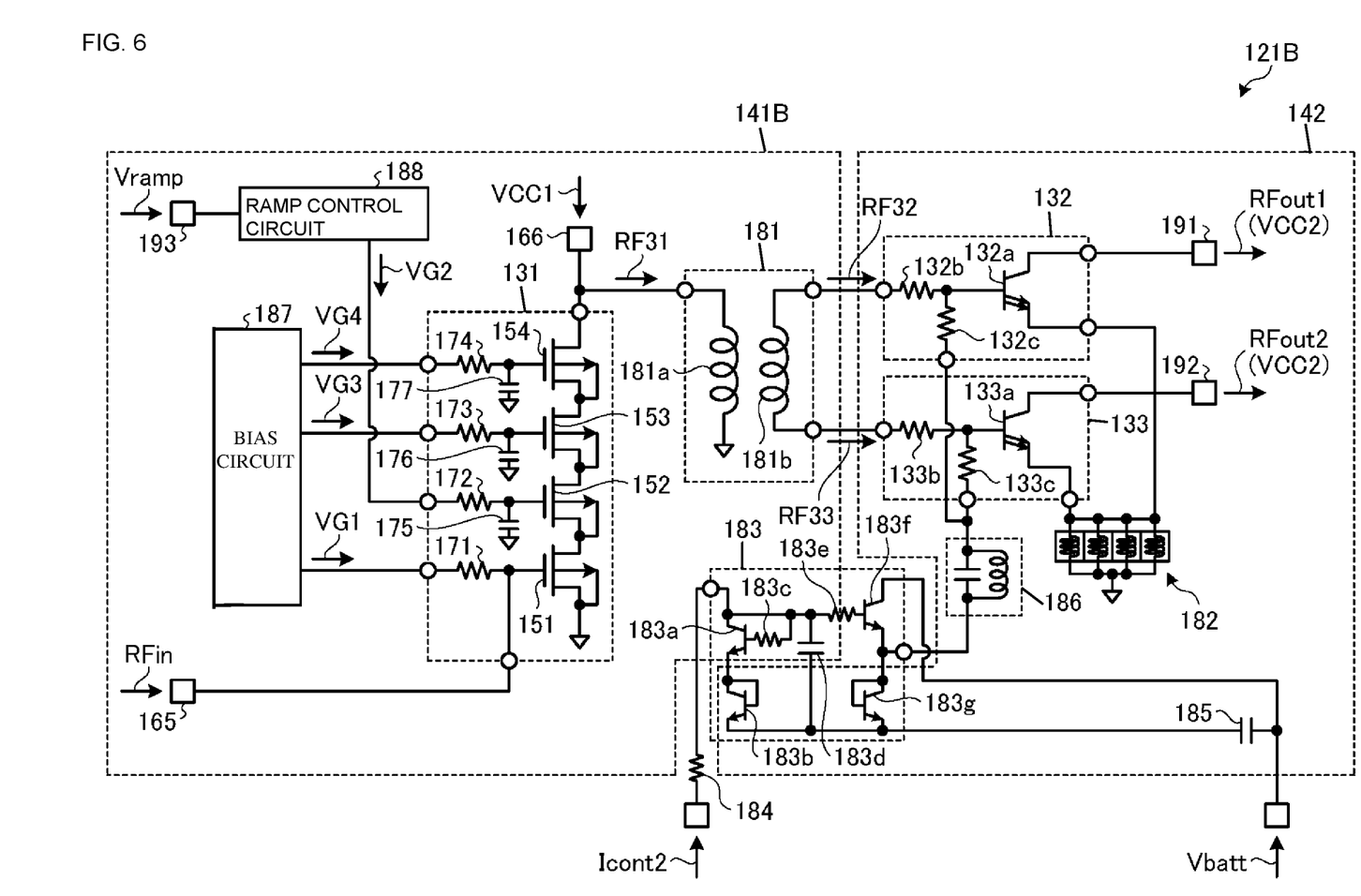
FIG. 6 is a diagram illustrating the configuration of a power amplifier circuit according to a fifth embodiment.

FIG. 6 is a diagram illustrating the configuration of a power amplifier circuit 121B according to a fifth embodiment.

The power amplifier circuit 121B includes a ramp control circuit 188 that is formed in or on a first chip 141B, as compared with the power amplifier circuit 121A (see FIG. 5).

For example, in a Gaussian filtered minimum shift keying (GMSK) transmission mode of global system for mobile communications (GSM), output power of a power amplifier circuit is controlled by a control voltage. The power amplifier circuit 121B can be used in such a GMSK transmission mode.

A control voltage Vramp is input to the ramp control circuit 188 via a terminal 193. The control voltage Vramp changes in a ramp manner, for example.

The ramp control circuit 188 outputs a bias voltage VG2 that is based on the control voltage Vramp to the gate of the transistor 152.

In the power amplifier circuit 121B, the ramp control circuit 188 is formed in or on the first chip 141B. Thus, a device in which the power amplifier circuit 121B is to be mounted can be easily designed, and the device can be reduced in size.

In the fifth embodiment, the ramp control circuit 188 outputs the bias voltage VG2 to the gate of the transistor 152 in accordance with the control voltage Vramp, but the present disclosure is not limited thereto. The ramp control circuit 188 may output a bias voltage VG1, VG3, or VG4 to the gate of the transistor 151, the gate of the transistor 153, or the gate of the transistor 154 in accordance with the control voltage Vramp.

While embodiments of the disclosure have been described above, it is to be understood that variations, modifications, and improvements will be apparent to those skilled in the art without necessarily departing from the scope and spirit of the disclosure. The embodiments are for facilitating the understanding of the present disclosure and are not intended to limit the present disclosure. The present disclosure includes the equivalents thereof. The scope of the disclosure, therefore, is to be determined solely by the following claims.

What is claimed is:

1. A power amplifier circuit comprising:
a first power amplifier in or on a first chip;
a balun comprising a primary winding and a secondary winding, the primary winding having a first end connected to the first power amplifier and a second end electrically connected to a reference potential;

a second power amplifier in or on a second chip and electrically connected to a first end of the secondary winding of the balun; and a third power amplifier in or on the second chip and electrically connected to a second end of the secondary winding of the balun, wherein:

the first power amplifier comprises a plurality of field-effect transistors that are stack-connected, and the second power amplifier and the third power amplifier each comprise:
  a plurality of unit bipolar transistors each including a first terminal that is electrically connected to the reference potential, a second terminal that is configured to receive a radio-frequency signal and a bias current, and a third terminal that is configured to output an amplified signal obtained by amplifying the radio-frequency signal,
  a common input terminal that is electrically connected in parallel to the second terminals of the plurality of unit bipolar transistors, and that is configured to receive the radio-frequency signal,
  a common bias terminal that is electrically connected in parallel to the second terminals of the plurality of unit bipolar transistors, and that is configured to receive the bias current,
  a common output terminal that is electrically connected in parallel to the third terminals of the plurality of unit bipolar transistors, and that is configured to output the amplified signal, and
  a plurality of resistance elements each being electrically connected between the common input terminal and the second terminal of a corresponding one of the plurality of unit bipolar transistors, and each being configured to limit a direct current component of the bias current.

2. The power amplifier circuit according to claim 1, wherein the first chip is a silicon on insulator (SOI) chip or a complementary metal oxide semiconductor (CMOS) chip, and the second chip is a gallium arsenide (GaAs) chip, a gallium nitride (GaN) chip, an indium phosphide (InP) chip, or a silicon germanium (SiGe) chip.

3. The power amplifier circuit according to claim 1, wherein the balun is in or on the first chip.

4. The power amplifier circuit according to claim 2, wherein the balun is in or on the first chip.

5. The power amplifier circuit according to claim 1, further comprising:
  a first bias circuit configured to output the bias current to the second power amplifier and to the third power amplifier,
  wherein the first bias circuit comprises:
    a first transistor including a first terminal, a second terminal, and a third terminal, the first terminal being electrically connected to the reference potential,
    a second transistor including a first terminal, a second terminal, and a third terminal, the first terminal of the second transistor being electrically connected to the second terminal and the third terminal of the first transistor, the second terminal of the second transistor being electrically connected to the third terminal of the second transistor, and the third terminal of the second transistor being configured to receive a control current,
    a third transistor including a first terminal, a second terminal, and a third terminal, the first terminal of the third transistor being electrically connected to the reference potential, and
    a fourth transistor including a first terminal, a second terminal, and a third terminal, the first terminal of the fourth transistor being electrically connected to the second terminal and the third terminal of the third transistor, the second terminal of the fourth transistor being electrically connected to the third terminal of the second transistor, the third terminal of the fourth transistor being configured to receive a power supply voltage, and the first terminal of the fourth transistor being configured to output the bias current.

6. The power amplifier circuit according to claim 2, further comprising:
  a first bias circuit configured to output the bias current to the second power amplifier and to the third power amplifier,
  wherein the first bias circuit comprises:
    a first transistor including a first terminal, a second terminal, and a third terminal, the first terminal being electrically connected to the reference potential,
    a second transistor including a first terminal, a second terminal, and a third terminal, the first terminal of the second transistor being electrically connected to the second terminal and the third terminal of the first transistor, the second terminal of the second transistor being electrically connected to the third terminal of the second transistor, and the third terminal of the second transistor being configured to receive a control current,
    a third transistor including a first terminal, a second terminal, and a third terminal, the first terminal of the third transistor being electrically connected to the reference potential, and
    a fourth transistor including a first terminal, a second terminal, and a third terminal, the first terminal of the fourth transistor being electrically connected to the second terminal and the third terminal of the third transistor, the second terminal of the fourth transistor being electrically connected to the third terminal of the second transistor, the third terminal of the fourth transistor being configured to receive a power supply voltage, and the first terminal of the fourth transistor being configured to output the bias current.

7. The power amplifier circuit according to claim 3, further comprising:
  a first bias circuit configured to output the bias current to the second power amplifier and to the third power amplifier,
  wherein the first bias circuit comprises:
    a first transistor including a first terminal, a second terminal, and a third terminal, the first terminal being electrically connected to the reference potential,
    a second transistor including a first terminal, a second terminal, and a third terminal, the first terminal of the second transistor being electrically connected to the second terminal and the third terminal of the first transistor, the second terminal of the second transistor being electrically connected to the third terminal of the second transistor, and the third terminal of the second transistor being configured to receive a control current,
    a third transistor including a first terminal, a second terminal, and a third terminal, the first terminal of the third transistor being electrically connected to the reference potential, and
    a fourth transistor including a first terminal, a second terminal, and a third terminal, the first terminal of the fourth transistor being electrically connected to the second terminal and the third terminal of the third transistor, the second terminal of the fourth transistor being electrically connected to the third terminal of the second transistor, the third terminal of the fourth transistor being configured to receive a power supply voltage, and the first terminal of the fourth transistor being configured to output the bias current.

8. The power amplifier circuit according to claim 5, wherein the first transistor is a bipolar transistor in or on the second chip.

9. The power amplifier circuit according to claim 1, further comprising:
a second bias circuit configured to output a bias voltage to the second terminal of each of the plurality of field-effect transistors.

10. The power amplifier circuit according to claim 2, further comprising:
a second bias circuit configured to output a bias voltage to the second terminal of each of the plurality of field-effect transistors.

11. The power amplifier circuit according to claim 3, further comprising:
a second bias circuit configured to output a bias voltage to the second terminal of each of the plurality of field-effect transistors.

12. The power amplifier circuit according to claim 5, further comprising:
a second bias circuit configured to output a bias voltage to the second terminal of each of the plurality of field-effect transistors.

13. The power amplifier circuit according to claim 8, further comprising:
a second bias circuit configured to output a bias voltage to the second terminal of each of the plurality of field-effect transistors.

14. The power amplifier circuit according to claim 1, further comprising:
a ramp control circuit configured to output a bias voltage to a second terminal of any one of the plurality of field-effect transistors, the bias voltage being based on a control voltage that changes in a ramped manner.

15. The power amplifier circuit according to claim 2, further comprising:
a ramp control circuit configured to output a bias voltage to a second terminal of any one of the plurality of field-effect transistors, the bias voltage being based on a control voltage that changes in a ramped manner.

16. The power amplifier circuit according to claim 3, further comprising:
a ramp control circuit configured to output a bias voltage to a second terminal of any one of the plurality of field-effect transistors, the bias voltage being based on a control voltage that changes in a ramped manner.

17. The power amplifier circuit according to claim 5, further comprising:
a ramp control circuit configured to output a bias voltage to a second terminal of any one of the plurality of field-effect transistors, the bias voltage being based on a control voltage that changes in a ramped manner.

18. The power amplifier circuit according to claim 8, further comprising:
a ramp control circuit configured to output a bias voltage to a second terminal of any one of the plurality of field-effect transistors, the bias voltage being based on a control voltage that changes in a ramped manner.

19. The power amplifier circuit according to claim 9, further comprising:
a ramp control circuit configured to output a bias voltage to a second terminal of any one of the plurality of field-effect transistors, the bias voltage being based on a control voltage that changes in a ramped manner.

\* \* \* \* \*